(12) United States Patent
Ganta (10) Patent No.: US 9,720,460 B2
(45) Date of Patent: Aug. 1, 2017

(54) POWER SUPPLY CHASSIS INCLUDING A RELEASE LEVER

(71) Applicant: HEWLETT PACKARD ENTERPRISE DEVELOPMENT LP, Houston, TX (US)

(72) Inventor: Sunil Ganta, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/120,509

(22) PCT Filed: Apr. 28, 2014

(86) PCT No.: PCT/US2014/035681
§ 371 (c)(1),
(2) Date: Aug. 19, 2016

(87) PCT Pub. No.: WO2015/167426
PCT Pub. Date: Nov. 5, 2015

(65) Prior Publication Data
US 2017/0017276 A1 Jan. 19, 2017

(51) Int. Cl.
*H05K 5/00* (2006.01)
*G06F 1/18* (2006.01)
(Continued)

(52) U.S. Cl.
CPC .............. *G06F 1/188* (2013.01); *H01R 33/97* (2013.01); *H05K 5/023* (2013.01); *H05K 5/0221* (2013.01);
(Continued)

(58) Field of Classification Search
CPC .......... H05K 5/00; H05K 5/02; H05K 5/0204; H05K 5/0208; H05K 5/0217;
(Continued)

(56) References Cited

U.S. PATENT DOCUMENTS 5,668,696 A * 9/1997 Schmitt ................ G11B 33/127
361/726
5,791,753 A * 8/1998 Paquin ................ H05K 7/1411
312/223.1

(Continued)

FOREIGN PATENT DOCUMENTS

WO    WO-2009134251    11/2009

OTHER PUBLICATIONS

"AC Power Supply for the Cisco Nexus 5596up Switch," Cisco Nexus 5000 Series Hardware Installation Guide, Mar. 2013, http://www.cisco.com/en/US/docs/switches/datacenter/nexus5000/hw/installation/guide/overview5500.html.

(Continued)

*Primary Examiner* — Angel R Estrada
(74) *Attorney, Agent, or Firm* — Hewlett Packard Enterprise Patent Department (57) ABSTRACT

Example implementations relate to power supply chassis. For example, an apparatus may include a power supply chassis. The power supply chassis may include a handle and a sidewall defining a latching slot. The handle may include an inner slot. The apparatus may also include a release lever to slidably connect to the handle via the inner slot. The release lever may include an engagement tab. The apparatus may further include a latching member in physical contact with the engagement tab. The latching member may include a latching fang. The release lever may control a position of the latching fang relative to the latching slot via a rotation of the latching member.

15 Claims, 6 Drawing Sheets

(51) Int. Cl.
*H01R 33/97* (2006.01)
*H05K 5/02* (2006.01)

(52) U.S. Cl.
CPC ......... *H05K 5/0247* (2013.01); *H05K 5/0256* (2013.01)

(58) Field of Classification Search
CPC .... H05K 5/0021; H05K 5/023; H05K 5/0247; H05K 5/0221; H05K 5/0256; H05K 7/1411; H05K 7/1412; H05K 7/1413; H01R 33/97; G06F 1/188; G06F 1/189; G06F 1/184; G11B 33/127
USPC .... 174/50, 520, 61, 535, 542; 361/727, 726, 361/725, 796, 679.31; 312/223.1, 223.2, 312/223.3, 223.6
See application file for complete search history.

(56) References Cited

U.S. PATENT DOCUMENTS

| | | | |
|---|---|---|---|
| 5,949,652 A | 9/1999 | McAnally et al. | |
| 5,959,834 A * | 9/1999 | Chang | G11B 33/025 361/726 |
| 6,137,684 A * | 10/2000 | Ayd | H05K 7/1411 361/727 |
| 6,222,736 B1 * | 4/2001 | Sim | G06F 1/184 361/727 |
| 6,439,917 B2 | 8/2002 | Tonozuka | |
| 6,667,887 B2 * | 12/2003 | Sim | H05K 7/1411 361/725 |
| 6,670,729 B2 * | 12/2003 | Skirmont | H02B 11/173 361/732 |
| 6,801,435 B1 | 10/2004 | Su et al. | |
| 6,839,237 B2 * | 1/2005 | Fite | H05K 7/1489 361/727 |
| 7,200,004 B2 * | 4/2007 | Chen | G06F 1/26 361/727 |
| 7,414,860 B1 | 8/2008 | Chen | |
| 7,675,754 B2 * | 3/2010 | Barina | H05K 7/1411 361/727 |
| 8,040,687 B2 * | 10/2011 | Pirillis | H05K 7/1412 361/801 |
| 2004/0070922 A1 | 4/2004 | Erskine | |
| 2006/0250777 A1 | 11/2006 | Chen | |
| 2007/0139902 A1 | 6/2007 | Chen | |
| 2009/0147459 A1 | 6/2009 | Nguyen et al. | |
| 2012/0033358 A1 | 2/2012 | Chen | |
| 2012/0293975 A1 | 11/2012 | Liang | |
| 2013/0094156 A1 | 4/2013 | Wang | |

OTHER PUBLICATIONS

"Install optical device," Server Products, SR1625UR Quick Start Guide—HTML Format, Nov. 11, 2013, http://www.intel.com/support/motherboards/server/sb/CS-032473.htm >.

"Removing a Power Supply Unit," ETegro Hyperion RS220 G4, Retrieved from Internet Feb. 25, 2014, http://www.etegro.com/service/articles/rs220g4.

PCT/ISA/KR, International Search Report, mailed Mar. 7, 2016, PCT/US2014/035681.

* cited by examiner

# POWER SUPPLY CHASSIS INCLUDING A RELEASE LEVER

BACKGROUND

A computing device, such as a server computer, may receive power via a power supply unit (PSU). A PSU is a device that converts alternating current (AC) to direct current (DC). A PSU for a rack mount computing device may be built as a detachable module that is insertable into a rack mount computing device chassis.

BRIEF DESCRIPTION OF THE DRAWINGS

Some examples of the present application are described with respect to the following figures.

DETAILED DESCRIPTION

As described above, a power supply unit (PSU) for a rack mount computing device may be built as a detachable module that is slideable into a rack mount computing device chassis. The PSU may be housed in a power supply chassis. The PSU may connect to the computing device by sliding power supply chassis housing the PSU into the rack mount computing device chassis. A user may then insert a power plug into the PSU and into a power outlet so that AC may flow from the power outlet to the PSU. The PSU may provide DC to components of the computing device by converting the AC to DC. When the PSU is to be replaced or serviced, the power supply chassis may be pulled from the rack mount computing device chassis. However, when the power supply chassis is pulled from the rack mount computing device chassis while the power cable is connected between the PSU and the power outlet, the removal of the power supply chassis causes arcing between the PSU and the components receiving power from the PSU. Thus, a likelihood of component damage is increased.

Examples described herein address the above challenges by providing a power supply chassis that includes a release lever. For example, the power supply chassis may house a PSU. The power supply chassis may include a handle having a release lever. The release lever may be in contact with a latching member including a latching fang. The latching fang may be used to secure the power supply chassis to a chassis of a computing device. The release lever may slide forward to retract the latching fang from the chassis of the computing device. When a power plug is inserted into a power plug receptor of the PSU, the presence of the power plug may reduce the movement of the release lever so that the latching fang may not be retracted from the chassis of the computing device. In this manner, examples described herein may reduce a likelihood that a PSU is removed from the chassis of a computing device while a power plug is inserted into a power plug receptor of the PSU.

Figure 1:
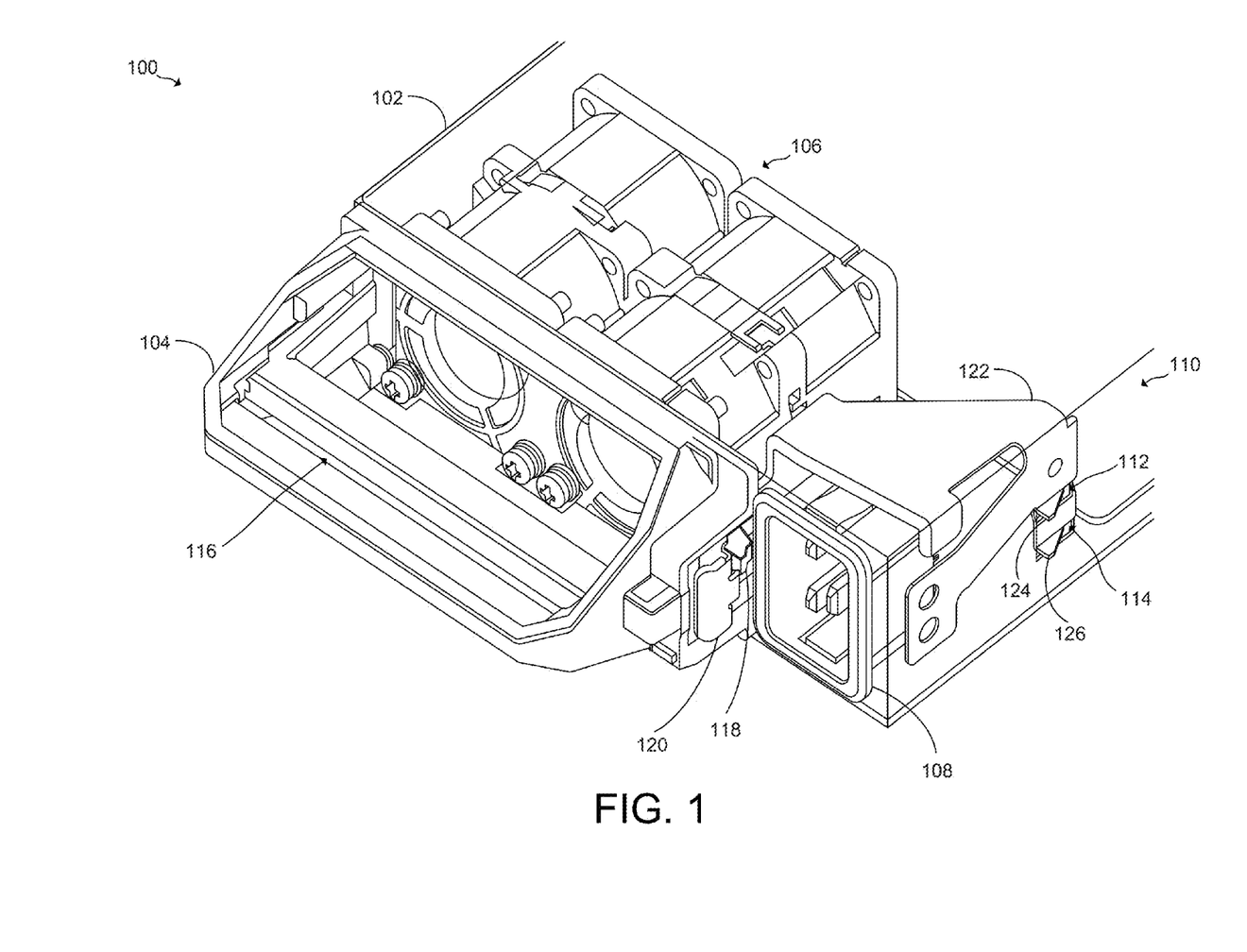
FIG. 1 is a see-through view of a power supply chassis including a handle having a release lever, according to an example.

Referring now to the figures, FIG. 1 is a see-through view of a power supply chassis including a handle having a release lever. A power supply chassis 100 may include a housing member 102 and a handle 104. Housing member 102 may house components of a power supply unit (PSU), such as exhaust fans 106, a power plug receptor 108, etc. For purpose of clarity, other components of the PSU are not shown in FIG. 1 besides exhaust fans 106 and power plug receptor 108. Housing member 102 may include a sidewall 110 that defines at least latching slot, such as latching slot 112 and latching slot 114. Latching slots 112 and 114 may facilitate engagement of power supply chassis 100 to a rack mount computing device chassis (not shown). Handle 104 may be fixedly attached to housing member 102. Handle 104 may be non-movable and/or non-rotatable. In some examples, handle 104 and housing member 102 may be formed as an integral component. In some examples, handle 104 and housing member 102 may be formed as separate components.

A release lever 116 may be connected to handle 104 via inner slots of handle 104 (not shown in FIG. 1). Handle 104 is described in more detail in FIGS. 5A-5B. Release lever 116 is described in more detail in FIG. 6. Release lever 116 may be slideable within the inner slots. Release lever 116 may include an engagement tab 118. Engagement tab 118 may be in physical contact with a latching tab 120 of a latching member 122. Latching member 122 is described in more detail in FIG. 7. Latching member 122 may also include latching fangs 124 and 126.

Latching fangs 124 and 126 may extend through latching slots 112 and 114 respectively. When power supply chassis 100 is engaged with the rack mount computing device chassis, latching fangs 124 and 126 may secure power supply chassis 100 to the rack mount computing device chassis. For example, the rack mount computing device chassis may have slots aligned with latching slots 112 and 114. Latching fangs 124 and 126 may extend through latching slots 112 and 114 and slots of rack mount computing device chassis so that power supply chassis 100 may not freely slide out of the rack mount computing device chassis.

Latching member 122 may be located inside housing member 102 such that latching tab 120 is exposed outside housing member 102. Latching fangs 124 and 126 may be exposed outside housing member 102 when release lever 116 is in a first position. The first position of release lever 116 may correspond to a position of release lever 116 when power supply chassis 100 is inserted into a rack mount computing device chassis. In some examples, release lever 116 may be spring-loaded so that release lever 116 may be in the first position as a default position when no external force is applied on release lever 116. During operation, latching member 122 may have a first degree of rotation when a power plug is not inserted into power plug receptor 108. Latching member 122 may have a second degree of rotation that is less than the first degree of rotation when a power plug is inserted into power plug receptor 108. Operation of power supply chassis 100 is described in more detail in FIGS. 2 and 3.

Figure 2:
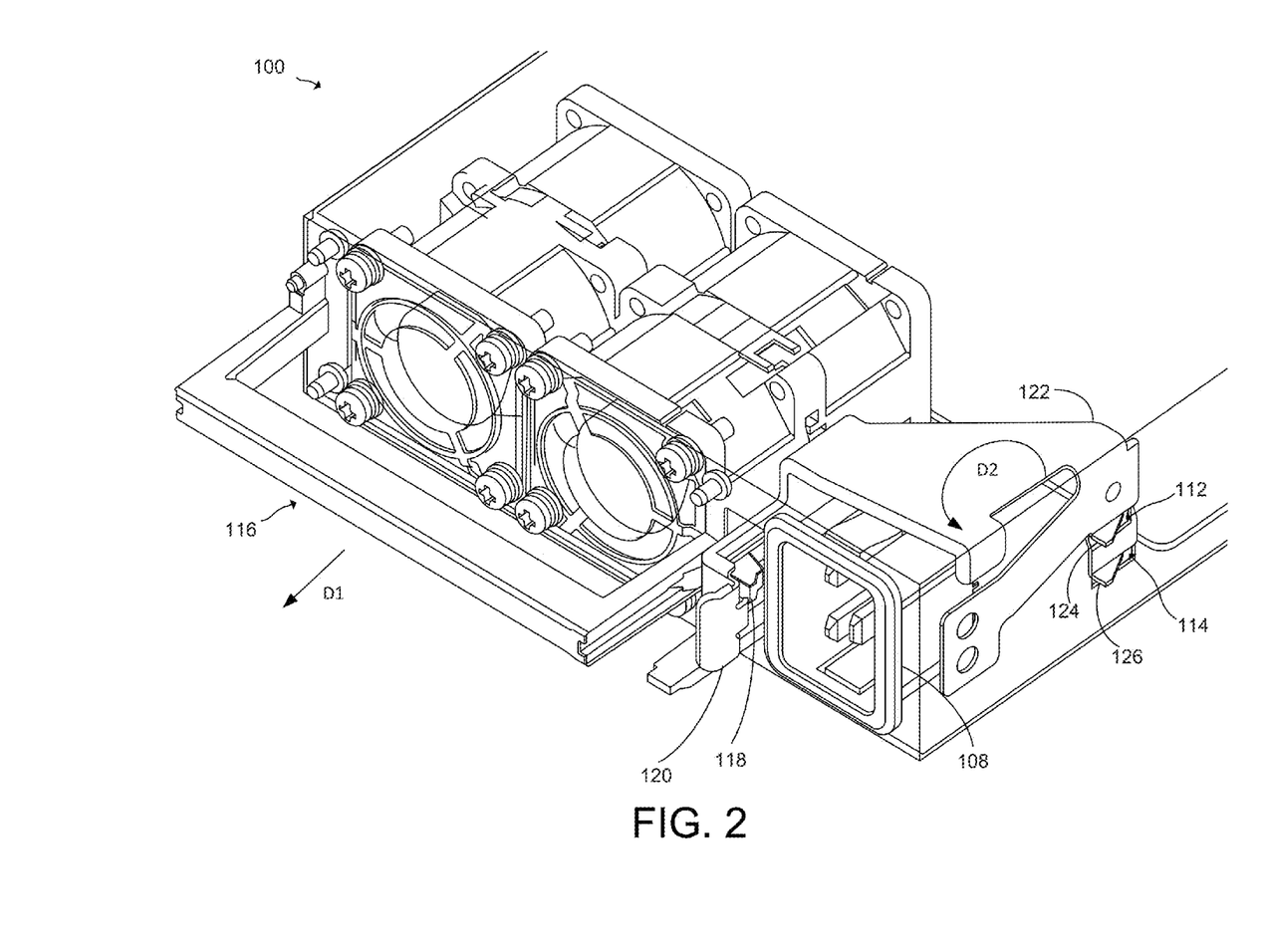
FIG. 2 is a side view of the power supply chassis of FIG. 1 to illustrate a release operation of the power supply chassis, according to an example.

FIG. 2 is a side view of power supply chassis 100 of FIG. 1 to illustrate a release operation of power supply chassis 100. For purpose of clarity, handle 104 is not shown in FIGS. 2 and 3. When power supply chassis 100 is to be removed from a rack mount computing device chassis, a user may pull release lever 116 towards handle 104 (as indicated by direction arrow D1) so that release lever 116 slides forward from the first position to a second position. Release lever 116 may be a particular distance away from handle 104 in the first position. Latching fangs 124 and 126 may be located outside of power supply chassis 100 when release lever 116 is in the first position. The second position of release lever 116 may correspond to a position of release lever 116 that is closer to handle 104 than the first position.

When release lever 116 slides forward towards handle 104 from the first position to the second position, engagement tab 118 may direct latching tab 120 to move towards power plug receptor 108 in response to the forward movement of release lever 116. The movement of latching tab 120 may direct latching member 122 to rotate horizontally towards power plug receptor 108 and away from release lever 116 (as indicated by direction arrow D2). The rotation of latching member 122 may direct latching fangs 124 and 126 to retract from latching slots 112 and 114. When release lever 116 is in the second position, latching fangs 124 and 126 may be located inside power supply chassis 100. Thus, power supply chassis 100 may be removed from the rack mount computing device chassis.

Figure 3:
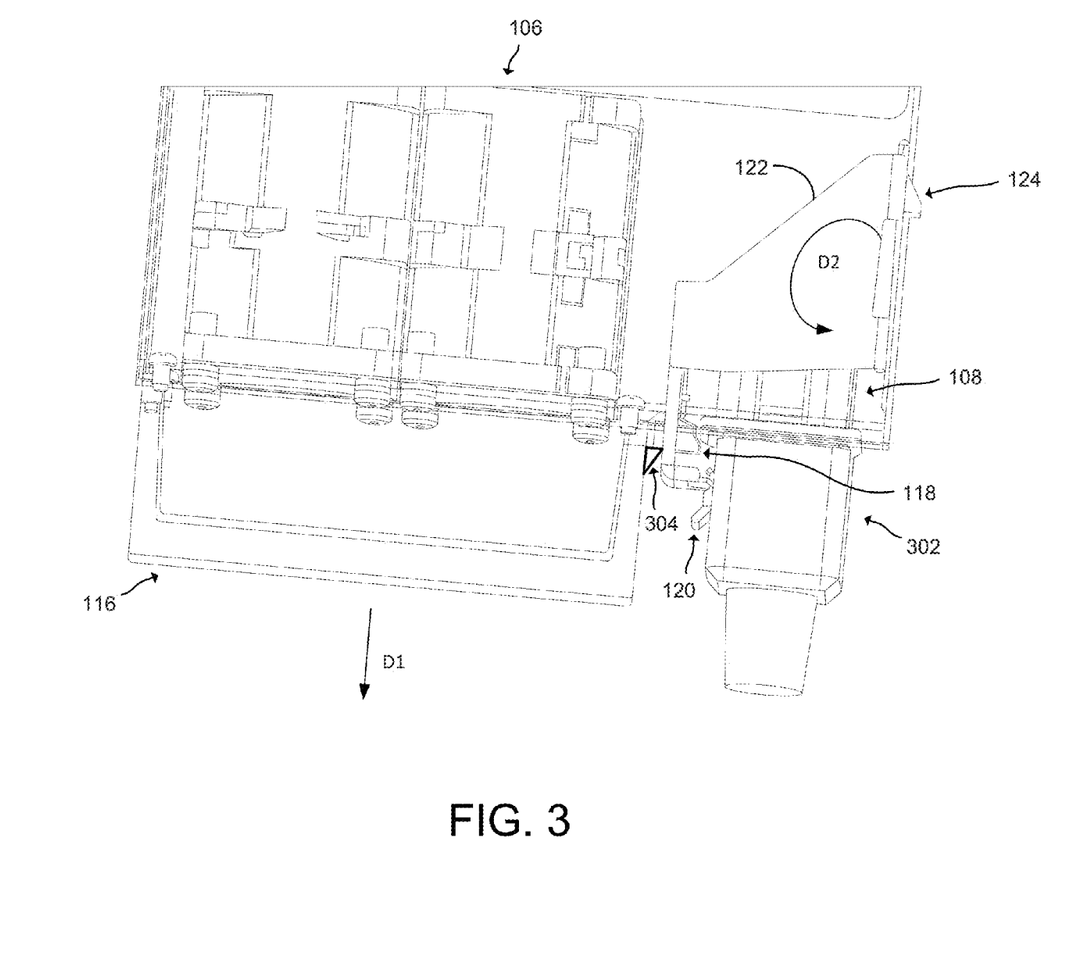
FIG. 3 is a top view of the power supply chassis of FIG. 1 to illustrate an operation of the power supply chassis of FIG. 1 when a power plug is inserted into a power plug receptor housed in the power supply chassis, according to an example.

FIG. 3 is a top view of power supply chassis 100 of FIG. 1 to illustrate an operation of power supply chassis 100 when a power plug 302 is inserted into power plug receptor 108. When release lever 116 slides forward from the first position to the second position, engagement tab 118 may direct latching member 122 to move towards power plug receptor 108 via latching tab 120. Latching tab 120 may come into contact with power plug 302 while latching member 122 is rotating towards power plug receptor 108. As power plug 302 is fixedly inserted into power plug receptor 108, a degree of rotation of latching member 122 is reduced by the presence of power plug 302. The forward movement of release lever 116 is also reduced by power plug 302. Release lever 116 may not reach the second position when power plug 302 is inserted in power plug receptor 108. Thus, latching fangs 124 and 126 may not retract inside power supply chassis 100 to release power supply chassis 100 from the rack mount computing device chassis. Accordingly, a likelihood of removing power supply chassis 100 from the rack mount computing device chassis when power plug 302 is inserted into power plug receptor 108 is reduced.

In some examples, handle 104 may include a guide member 304 to further direct the rotation of latching member 122 in response to a forward movement of release lever 116. Guide member 304 may also reduce a likelihood of latching member 122 pushing back into components of the PSU, such as exhaust fans 106, when being blocked by power plug 302.

Figure 4A:
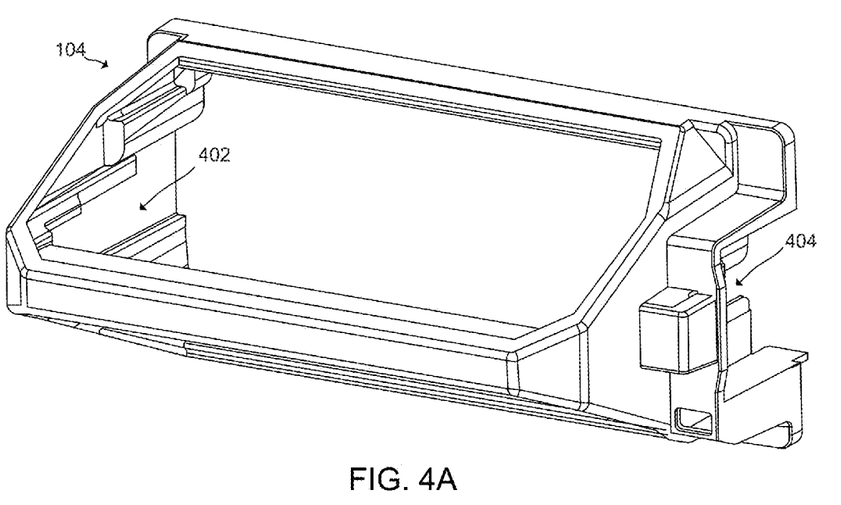
FIG. 4A is a front view of the handle of the power supply chassis of FIG. 1, according to an example.
Figure 4B:
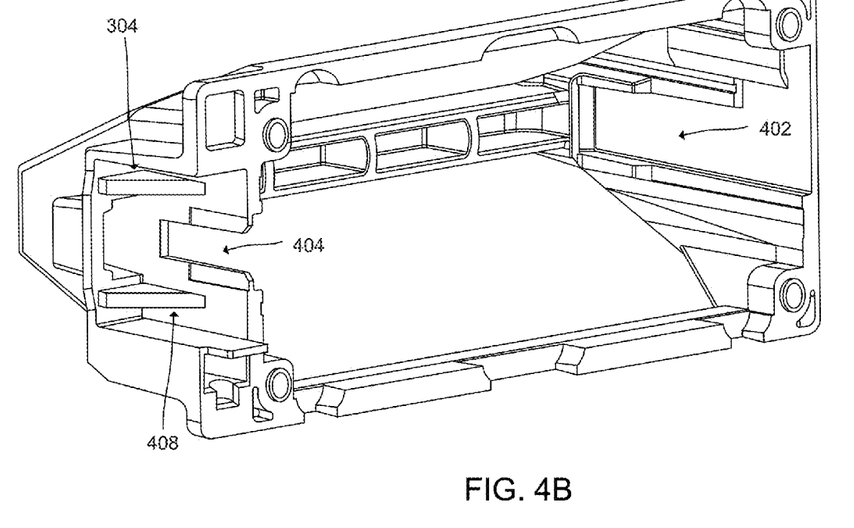
FIG. 4B is a back view of the handle of the power supply chassis of FIG. 1, according to an example.

FIG. 4A is a front view of handle 104 of power supply chassis 100. Handle 104 may include inner slots 402 and 404. Release lever 116 may be slidably connected to handle 104 via inner slots 402 and 404. In some examples, handle 104 may be made using metal, such as aluminum, steel, etc. In some examples, handle 104 may be made using plastic via injection molding. FIG. 4B is a back view of handle 104. Handle 104 may include guide members 304 and 408. As described in FIG. 3, guide members 304 and 408 may further direct rotation of latching member 122.

Figure 5:
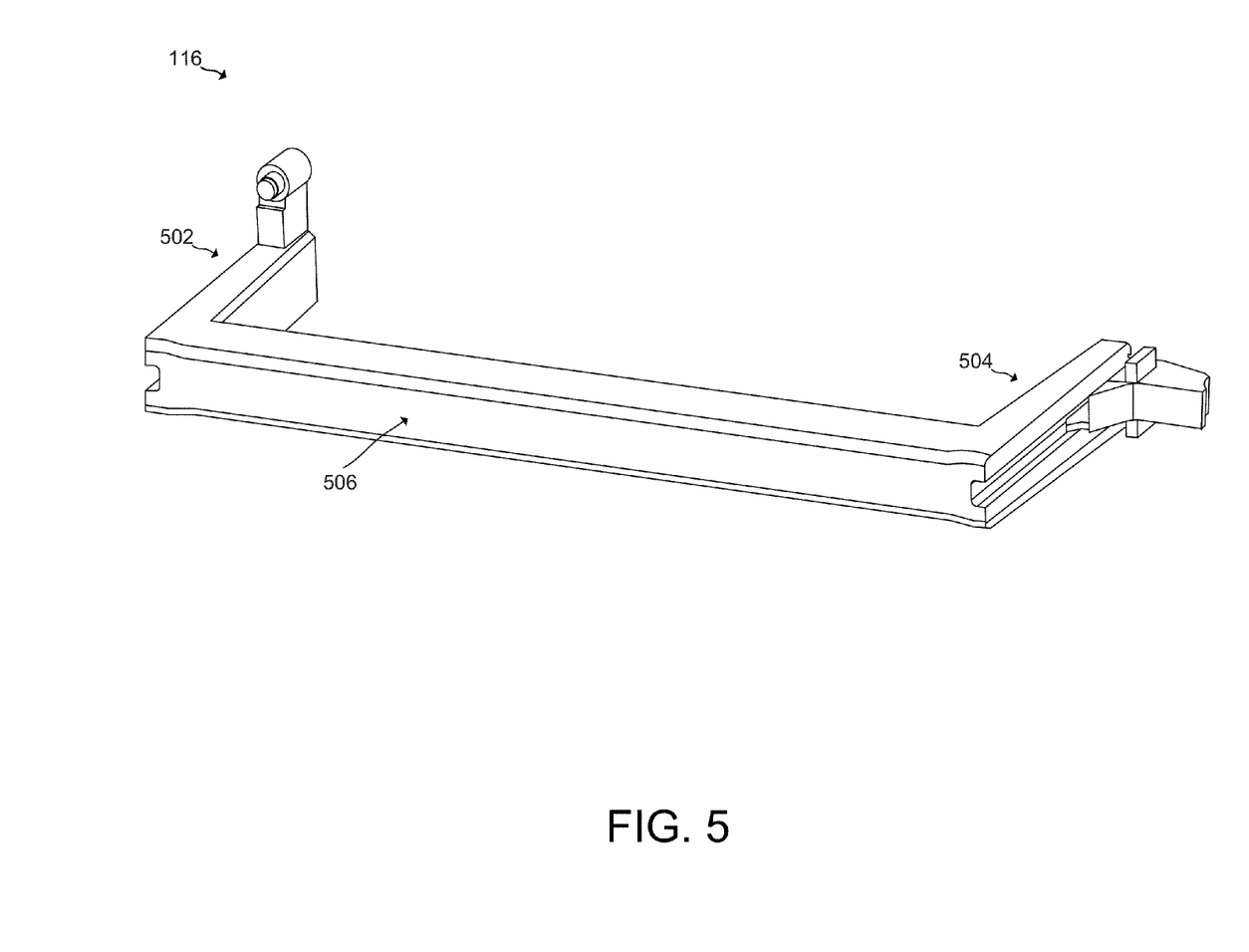
FIG. 5 is a front view of a release lever of the power supply chassis of FIG. 1, according to an example.

FIG. 5 is a front view of release lever 116 of power supply chassis 100 of FIG. 1. Release lever 116 may include a first arm member 502, a second arm member 504, and a main member 506. Arm members 502 and 504 may engage with inner slots 404 and 402 respectively to enable sliding of release lever 116 within handle 104. In some examples, release lever 116 may be made using metal, such as aluminum, steel, etc. In some examples, release lever 116 may be made using plastic via injection molding.

Figure 6:
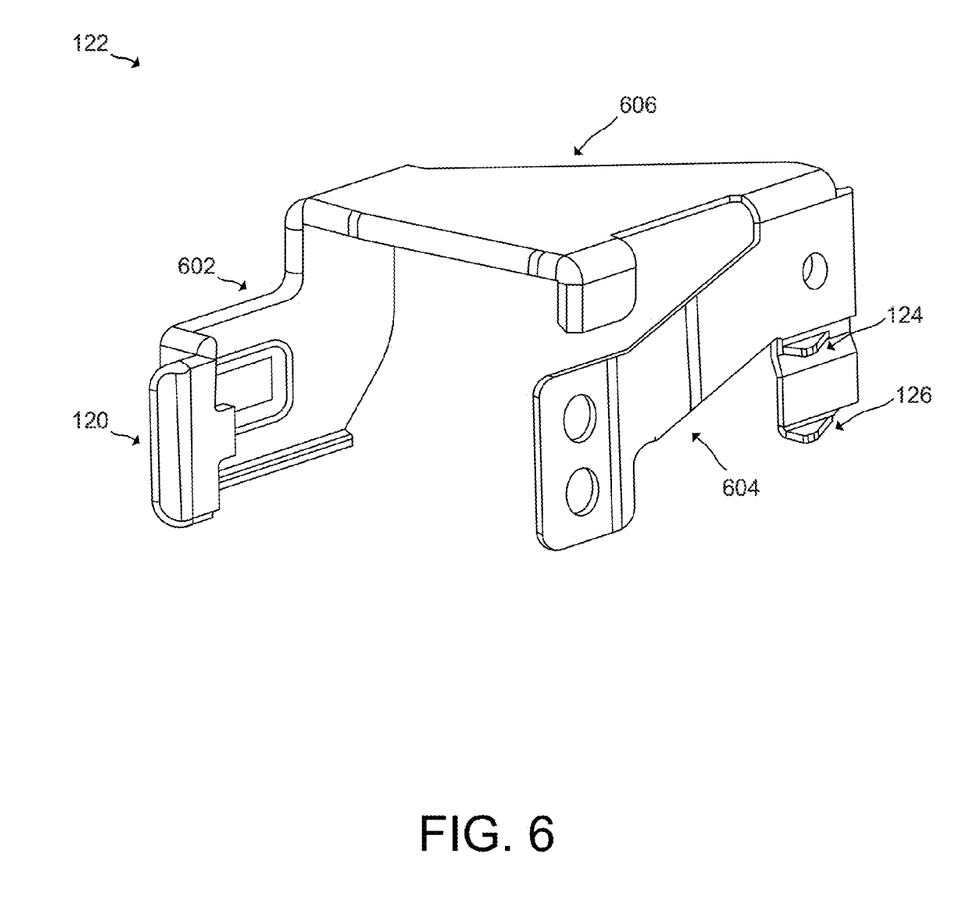
FIG. 6 is a front view of a latching member of the power supply chassis of FIG. 1, according to an example.

FIG. 6 is a front view of latching member 122 of power supply chassis 100 of FIG. 1. Latching member 122 may include a first support arm 602, a second support arm 604, and a body member 606. Latching tab 120 may be formed as a region of first support arm 602. Latching fangs 124 and 126 may be formed as regions of second support arm 604. In some examples, latching member 122 may be made using metal, such as aluminum, steel, etc. In some examples, latching member 122 may be made using plastic via injection molding.

The use of "comprising", "including" or "having" are synonymous and variations thereof herein are meant to be inclusive or open-ended and do not exclude additional unrecited elements or method steps.

What is claimed is:

1. An apparatus comprising:
   a power supply chassis, wherein the power supply chassis includes a handle and a sidewall defining a latching slot, and wherein the handle includes an inner slot;
   a release lever to slidably connect to the handle via the inner slot, wherein the release lever includes an engagement tab; and
   a latching member in physical contact with the engagement tab, wherein the latching member includes a latching fang, the release lever to control a position of the latching fang relative to the latching slot via a rotation of the latching member.

2. The apparatus of claim 1, the latching member to rotate towards the release lever in response to a forward movement of the release lever.

3. The apparatus of claim 1, further comprising a power plug receptor, wherein a movement of the release lever is dependent on a presence of a power plug connected to the power plug receptor.

4. The apparatus of claim 1, wherein the handle is non-rotatable.

5. The apparatus of claim 1, wherein the handle further includes a guide member to direct the rotation of the latching member in response to a forward movement of the release lever.

6. The apparatus of claim 1, the latching fang to extend through the latching slot when the release lever is in a first position, the latching fang to retract from the latching slot when the release lever is to move from the first position to a second position.

7. An apparatus comprising:
   a power supply chassis, wherein the power supply chassis includes a handle and a sidewall defining a latching slot, and wherein the handle includes an inner slot;
   a release lever to slidably connect to the handle via the inner slot, wherein the release lever includes an engagement tab; and
   a latching member in physical contact with the engagement tab, wherein the latching member includes:
      a body member;
      a first support arm including a latching tab; and
      a second support arm including a latching fang, the release lever to control a position of the latching fang relative to the latching slot via a rotation of the latching member.

8. The apparatus of claim 7, wherein the body member is located inside the power supply chassis, wherein the latching fang is located outside the power supply chassis when the release lever is in a first position, and wherein the latching fang is located inside the power supply chassis when the release lever is in a second position.

9. The apparatus of claim 8, wherein the engagement tab is located outside the power supply chassis.

10. The apparatus of claim 7, wherein the rotation is a horizontal rotation.

11. The apparatus of claim 7, wherein the handle further includes a guide member to direct the rotation of the latching member in response to a forward movement of the release lever.

12. The apparatus of claim 7, the latching fang to extend through the latching slot when the release lever is in a first position, the latching fang to retract from the latching slot when the release lever is to move from the first position to a second position.

13. An apparatus comprising:
- a power supply chassis, wherein the power supply chassis includes a handle and a sidewall defining a latching slot, and wherein the handle includes an inner slot;
- a power plug receptor;
- a release lever to slidably connect to the handle via the inner slot, wherein the release lever includes an engagement tab; and
- a latching member in physical contact with the engagement tab, the latching member including a latching fang, the release lever to control a position of the latching fang relative to the latching slot via a rotation of the latching member, wherein the latching member has a first degree of rotation when the power plug receptor is disengaged; and wherein the latching member has a second degree of rotation that is less than the first degree of rotation when the power plug receptor is engaged with a power plug.

14. The apparatus of claim 13, wherein the handle further includes a guide member to direct the rotation of the latching member in response to a forward movement of the release lever.

15. The apparatus of claim 13, the latching fang to extend through the latching slot when the release lever is in a first position, the latching fang to retract from the latching slot when the release lever is to move from the first position to a second position.

* * * * *